United States Patent
Chen et al.

(10) Patent No.: US 10,650,986 B2
(45) Date of Patent: May 12, 2020

(54) KEYBOARD

(71) Applicant: CHICONY ELECTRONICS CO., LTD., New Taipei (TW)

(72) Inventors: Chih-Hao Chen, New Taipei (TW); Mitsuo Horiuchi, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 16/410,678

(22) Filed: May 13, 2019

(65) Prior Publication Data

US 2020/0111626 A1 Apr. 9, 2020

Related U.S. Application Data

(60) Provisional application No. 62/740,963, filed on Oct. 4, 2018.

(30) Foreign Application Priority Data

Oct. 25, 2018 (TW) .............................. 107137780 A

(51) Int. Cl.
*H01H 13/70* (2006.01)
*H01H 13/7065* (2006.01)

(52) U.S. Cl.
CPC .............................. *H01H 13/7065* (2013.01)

(58) Field of Classification Search
CPC .... H01H 13/7065; H01H 13/84; H01H 3/125; H01H 13/76; G06F 1/16

USPC ......... 200/5 A, 275, 308, 344, 517; 361/807
See application file for complete search history.

(56) References Cited

U.S. PATENT DOCUMENTS

| 9,852,854 | B1 | 12/2017 | Wang | |
|---|---|---|---|---|
| 2014/0151208 | A1* | 6/2014 | Chou | H01H 13/7065 200/5 A |
| 2015/0047959 | A1* | 2/2015 | Wu | H01H 3/125 200/344 |

FOREIGN PATENT DOCUMENTS

TW    M564194 U    7/2018

* cited by examiner

*Primary Examiner* — Edwin A. Leon
*Assistant Examiner* — Iman Malakooti
(74) *Attorney, Agent, or Firm* — Muncy, Geissler, Olds & Lowe, P.C.

(57) ABSTRACT

A keyboard is disclosed, which includes a base plate and a thin film circuit board. The base plate includes a first part, a second part, and an inclined part. Two edges of the inclined part are connected to the first part and the second part, respectively. The inclined part includes a hollow portion. The thin film circuit board is disposed on the base plate and includes a first region, a second region, and a connecting portion. The connecting portion has a first connecting end, a second connecting end, and an inclined segment. The first connecting end is connected to the first region; the second connecting end is connected to the second region. The first connecting end and the second connecting end correspond to different positions on an axial direction. Moreover, part of the inclined segment is located in the hollow portion.

10 Claims, 5 Drawing Sheets

KEYBOARD

CROSS REFERENCE TO RELATED APPLICATIONS

This application claims priority of Application No. 107137780 filed in Taiwan on Oct. 25, 2018 under 35 U.S.C. § 119; and this application claims priority of U.S. Provisional Application No. 62/740,963 filed on Oct. 4, 2018 under 35 U.S.C. § 119(e), the entire contents of all of which are hereby incorporated by reference.

BACKGROUND

1. Technical Field

The present application relates to a keyboard, particularly to a fixing structure of a keyboard.

2. Description of the Related Art

A keyboard is commonly used in conjunction with a computer as one of the essential input devices in present day. Generally, when most computers and peripheral devices used with computers are developed, lighter, thinner, shorter, and more compact designs are often preferred or required. Keyboards also have been occupying less volume over time. Earlier keyboards were relatively large while thin-film keyboards are very common today. The main structure of a thin-film keyboard includes a base plate, a thin film circuit board, and a plurality of keys. In general, the base plate has a flat surface so that the thin film circuit board can be flatly disposed on the base plate. Moreover, the plurality of keys are located in the same horizontal plane.

In order to enhance the user operation experience, a stepped base plate 91 is also available on the market, as shown in FIG. 1. FIG. 1 is a schematic drawing of a prior art keyboard 9 having a stepped base plate 91. In specific, the stepped base plate 91 includes a first part 911 and a second part 912, and the height of the first part 911 is different from the height of the second part 912. Moreover, specific keys 92 such as function (Fn) keys and parts of modifier keys are disposed at the first part 911, which is higher; the other keys 92 are disposed at the second part 912, which is lower. The function (Fn) keys and parts of modifier keys are located in a horizontal plane different from the horizontal plane in which the other keys 92 (most of the keys 92) are located, thereby enhancing the user operation experience. In addition, the bottom of the first part 911 can provide additional space for disposing heat dissipation components and/or electronic components, etc. so as to further increase the durability and improve the functionality of the keyboard 9.

A thin film circuit board 93 has to be disposed at the bottom of the keys 92 to transmit a trigger signal, whether the keys 92 are located at the first part 911 or the second part 912. In the prior arts, the thin film circuit board 93 is divided into multiple regions. For example, a first region 931 is disposed on the first part 911; a second region 932 is disposed on the second part 912. Moreover, a connecting portion 933 (i.e. the configuration of tracks) is disposed on an inclined part 913, which is between the first part 911 and the second part 912, to connect the thin film circuit board 93 of different regions (the first region 931 and the second region 932). Furthermore, the elasticity of the connecting portion 933 of the thin film circuit board 93 causes the connecting portion 933 to bulge or not to be disposed flat on the inclined part 913 of the base plate 91. Thus, currently, fixing plates 94 are placed on the connecting portion 933 and are riveted to the base plate 91. In other words, an additional assembly step of riveting is required. Therefore, there is room for further improvements in the manufacturing and assembly process of the keyboard.

SUMMARY

In order to solve the aforementioned problem, it is the primary object of the present application to provide a keyboard. The base plate of the keyboard has a hollow portion and a limiting portion. Moreover, an inclined segment of the thin film circuit board can extend downward and extend along an axial direction. The above-mentioned designs solve the problem of the complicated manufacturing and assembly process when a connecting portion of the thin film circuit board is fixed by using fixing members in the prior arts.

In order to achieve the above-mentioned object, the present application provides a keyboard, which includes a base plate and a thin film circuit board. The base plate includes a first part, a second part, and an inclined part. The inclined part has an upper edge and a lower edge. The upper edge is connected to the first part. The lower edge is connected to the second part. Moreover, the upper edge and the lower edge extend along an axial direction. The inclined part includes at least one hollow portion and at least one limiting portion. The limiting portion extends from the upper edge toward the lower edge. Moreover, a lower surface of the limiting portion faces toward the hollow portion. The thin film circuit board is disposed on the base plate and includes a first region, a second region, and at least one connecting portion. The first region is located on the first part. The second region is located on the second part. The connecting portion has a first connecting end, a second connecting end, and an inclined segment. The first connecting end is connected to the first region; the second connecting end is connected to the second region. The first connecting end and the second connecting end correspond to different positions on the axial direction. The inclined segment is located between the first connecting end and the second connecting end. Moreover, part of the inclined segment is located in the hollow portion. Part of inclined segment is located under the limiting portion.

According to one embodiment of the present application, the connecting portion includes an extending segment and a planar segment. Two opposite sides of the extending segment are connected to the first connecting end and the planar segment, respectively. The extending segment and the planar segment extend from the first connecting end toward the second region. The inclined segment extends from a side of the planar segment adjacent to the extending segment to the second connecting end along the axial direction.

According to one embodiment of the present application, the inclined part has at least one supporting portion. The supporting portion corresponds to the planar segment of the connecting portion and supports the planar segment.

According to one embodiment of the present application, the supporting portion extends the lower edge toward the upper edge.

According to one embodiment of the present application, the first part has at least one first concave portion, and the first concave portion communicates with the hollow portion of the inclined part and is disposed adjacent to the first connecting end.

According to one embodiment of the present application, the second part has at least one second concave portion, and the second concave portion communicates with the hollow portion of the inclined part and is disposed adjacent to the second connecting end.

According to one embodiment of the present application, the width of the inclined segment is substantially equal to the length of the second connecting end.

According to one embodiment of the present application, the second region has a protruding portion, and one end of the protruding portion is connected to part of the second connecting end.

According to one embodiment of the present application, the length of the first connecting end is substantially equal to the length of the second connecting end.

According to one embodiment of the present application, the first region has at least two arc-shaped concave portions disposed on two opposite sides of the first connecting end.

As described above, the keyboard of the present application includes a base plate and a thin film circuit board. The inclined part of the base plate has a hollow portion and a limiting portion. The lower surface of the limiting portion faces toward the hollow portion. The connecting portion of the thin film circuit board has a first connecting end, a second connecting end, and an inclined segment. Because the first connecting end and the second connecting end correspond to different positions on the axial direction, and because the inclined segment is located between the first connecting end and the second connecting end, the inclined segment can extend downward and extend along the axial direction. Thus, a longer connecting portion can be formed to reduce the elastic stress of the material itself of the thin film circuit board. Also, the situation that the connecting portion bounces up because of elastic force is avoided. Moreover, part of the inclined segment of the connecting portion is located in the hollow portion. Thus, the limiting portion can press against the connecting portion (prevent the connecting portion from moving) such that the thin film circuit board is fixed to the base plate. Therefore, the thin film circuit board is fixed without using other fixing members. This also simplifies the manufacturing process and reduces the steps of assembly.

DETAILED DESCRIPTION OF THE PREFERRED EMBODIMENT

The advantages and innovative features of the application will become more apparent from the following detailed description when taken in conjunction with the accompanying drawings.

Figure 2:
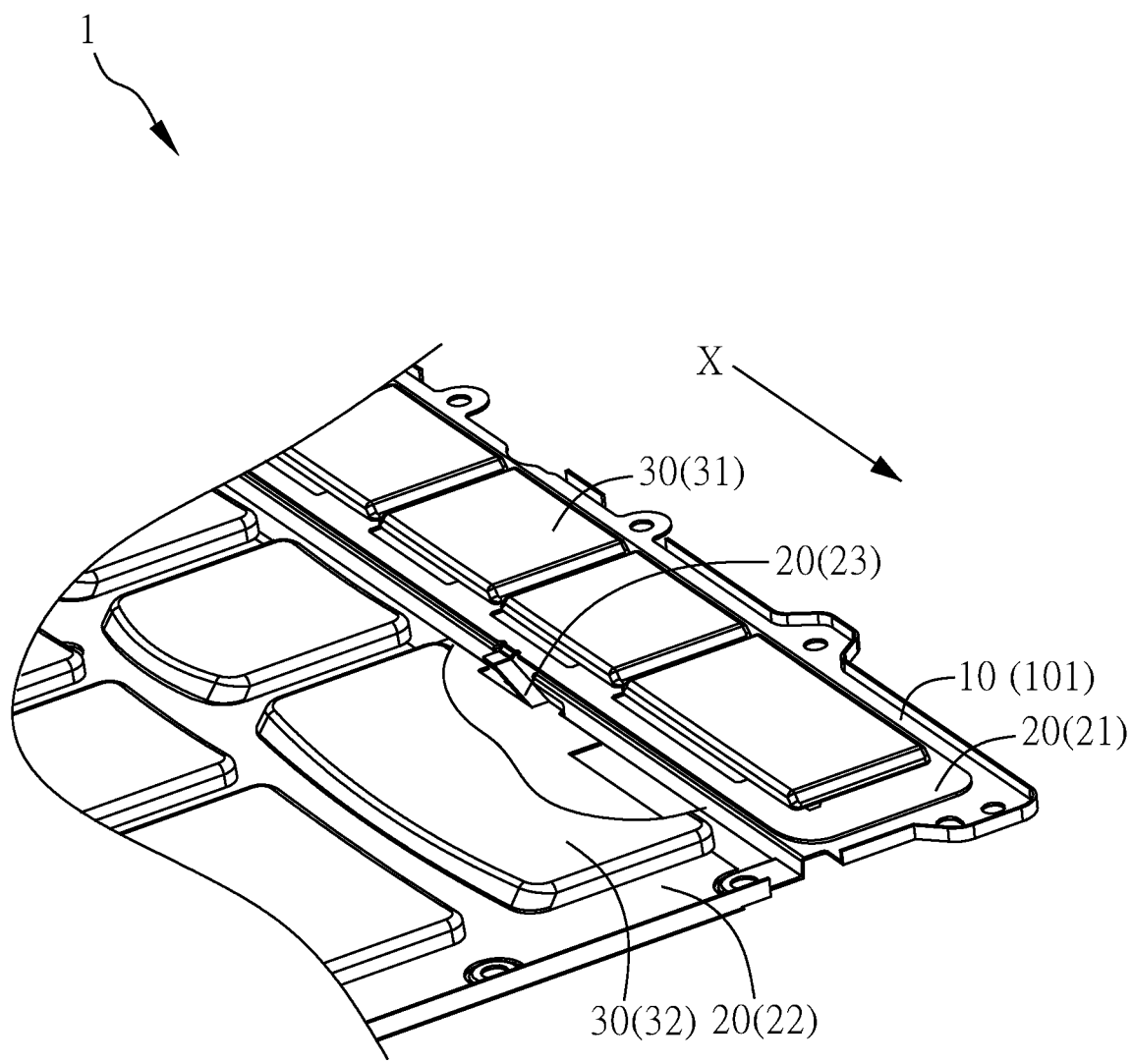
FIG. 2 is a partial schematic drawing of a keyboard according to one embodiment of the present application.
Figure 3:
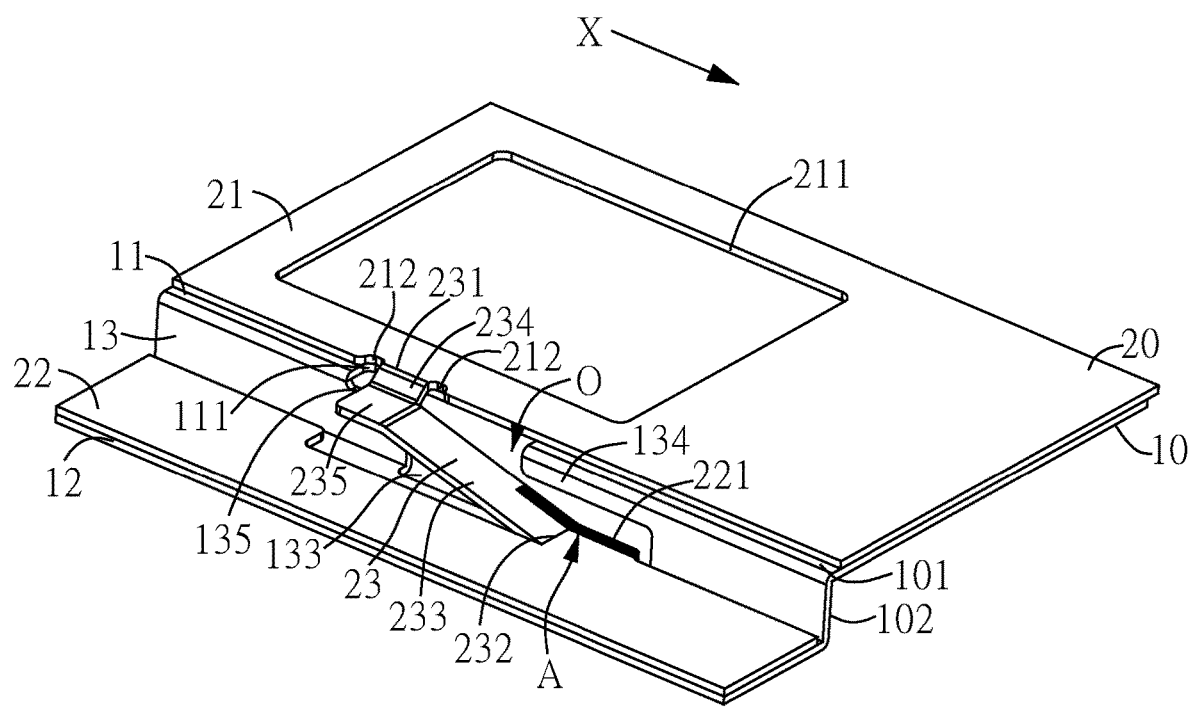
FIG. 3 is a partial enlarged schematic view of a base plate and a thin film circuit board as shown in FIG. 2.
Figure 4:
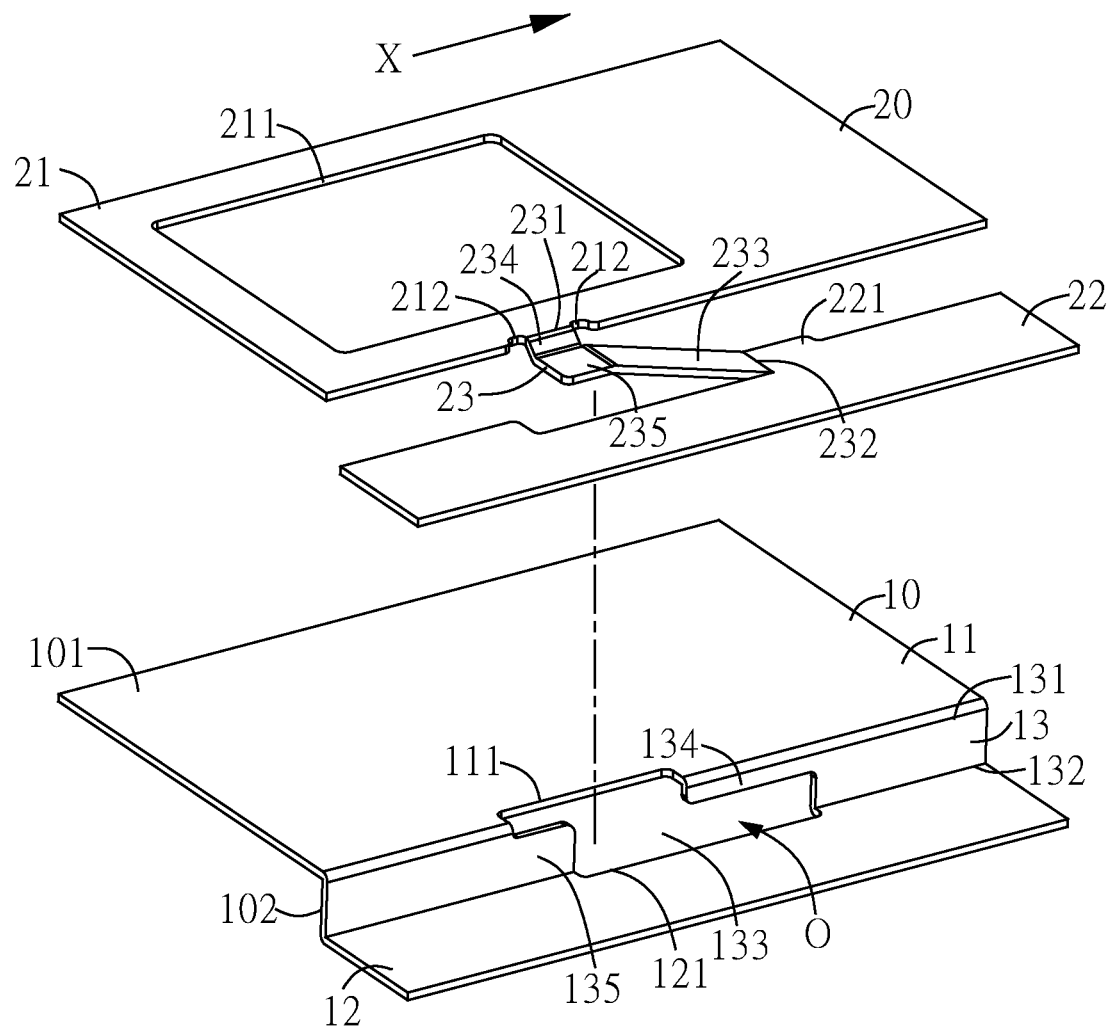
FIG. 4 is a schematic exploded view of the base plate and the thin film circuit board as shown in FIG. 3.

FIG. 2 is a partial schematic drawing of a keyboard according to one embodiment of the present application. FIG. 3 is a partial enlarged schematic view of a base plate and a thin film circuit board as shown in FIG. 2. FIG. 4 is a schematic exploded view of the base plate and the thin film circuit board as shown in FIG. 3. Please refer to FIG. 2, FIG. 3 and FIG. 4. In this embodiment, a keyboard 1 includes a base plate 10 and a thin film circuit board 20. The base plate 10 mainly includes a first part 11, a second part 12, and an inclined part 13. The inclined part 13 connects the first part 11 to the second part 12.

The first part 11 and the second part 12 are connected to each other by the inclined part 13. More specifically, in this embodiment, the base plate 10 is a stepped structure. The base plate 10 has the first part 11 and the second part 12, and the height of the first part 11 is different from the height of the second part 12. In other words, there is a height difference between the first part 11 and the second part 12. Moreover, in this embodiment, the first part 11 is higher than the second part 12. The inclined part 13 has an upper edge 131 and a lower edge 132. The upper edge 131 is connected to the first part 11. The lower edge 132 is connected to the second part 12. In this embodiment, the inclined part 13 is a vertical plane, as shown in FIG. 3 and FIG. 4. In other embodiments, the inclined part 13 can also be an inclined plane with a smaller angle of inclination. However, please note that the scope of the present application is not limited to the above description. In addition, the upper edge 131 and the lower edge 132 extend along an axial direction X. In other words, the upper edge 131 is parallel to the axial direction X. The lower edge 132 is parallel to the axial direction X, too. This embodiment is described with the example of the direction of the long axis of the keyboard 1. However, please note that the scope of the present application is not limited to the above description.

In this embodiment, the thin film circuit board 20 is disposed on the base plate 10. For the sake of clarity, in this embodiment, the two surfaces of the base plate 10 which are opposite to each other are referred to as a top surface 101 and a bottom surface 102, respectively. In other words, the base plate 10 has a top surface 101 and a bottom surface 102 which are opposite to each other. The thin film circuit board 20 is disposed on the top surface 101. Moreover, the thin film circuit board 20 is divided into a first region 21, a second region 22, and at least one connecting portion 23 according to the positions in which they are disposed. The first region 21 is located on the first part 11. The second region 22 is located on the second part 12. Thus, the first region 21 and the second region 22 are both parallel to the axial direction X. The connecting portion 23 is located at the inclined part 13. In this embodiment, the connecting portion 23 is not bonded to the inclined part 13. This will be described in detail below.

In this embodiment, the keyboard 1 also includes a plurality of keys 30. Some of the keys 30 are disposed at the first part 11 of the base plate 10; some of the keys 30 are disposed at the second part 12. For example, modifier keys 31, such as function keys (Fn keys), are disposed at the first part 11; regular keys 32 are disposed at the second part 12. The first region 21 of the thin film circuit board 20 has an opening 211 for containing and fixing the coupling member of the modifier keys 31. The second region 22 also has an opening (not shown in figures) for containing and fixing the coupling member of the regular keys 32. Moreover, the first region 21 of the thin film circuit board 20 is used for sending a trigger signal of the modifier keys 31; the second region 22 is used for sending a trigger signal of the regular keys 32. The first region 21 and the second region 22 are connected to each other by the connecting portion 23. In other words, tracks (connecting portion 23) are configured at the inclined part 13 such that the circuits of the first region 21 and the second region 22 are connected by the connecting portion 23. In addition, the present application is not limited to the number of the connecting portions 23. For example, a connecting portion 23 may correspond to a single modifier key 31 or two to three modifier keys 31. However, please note that the scope of the present application is not limited to the above description.

In this embodiment, the inclined part 13 of the base plate 10 includes at least one hollow portion 133 and at least one limiting portion 134. Where the hollow portion 133 is disposed corresponds to the position of the connecting portion 23. The number of the hollow portions 133 corresponds to the number of the connecting portions 23, too. With the design of the hollow portion 133 and the limiting portion 134, the connecting portion 23 is fixed. This will be described in detail below. In this embodiment, the limiting portion 134 extends from the upper edge 131 toward the lower edge 132. The lower surface of the limiting portion 134 faces toward the hollow portion 133. In other words, the lower surface of the limiting portion 134 is part of the inner wall of the hollow portion 133.

Figure 5:
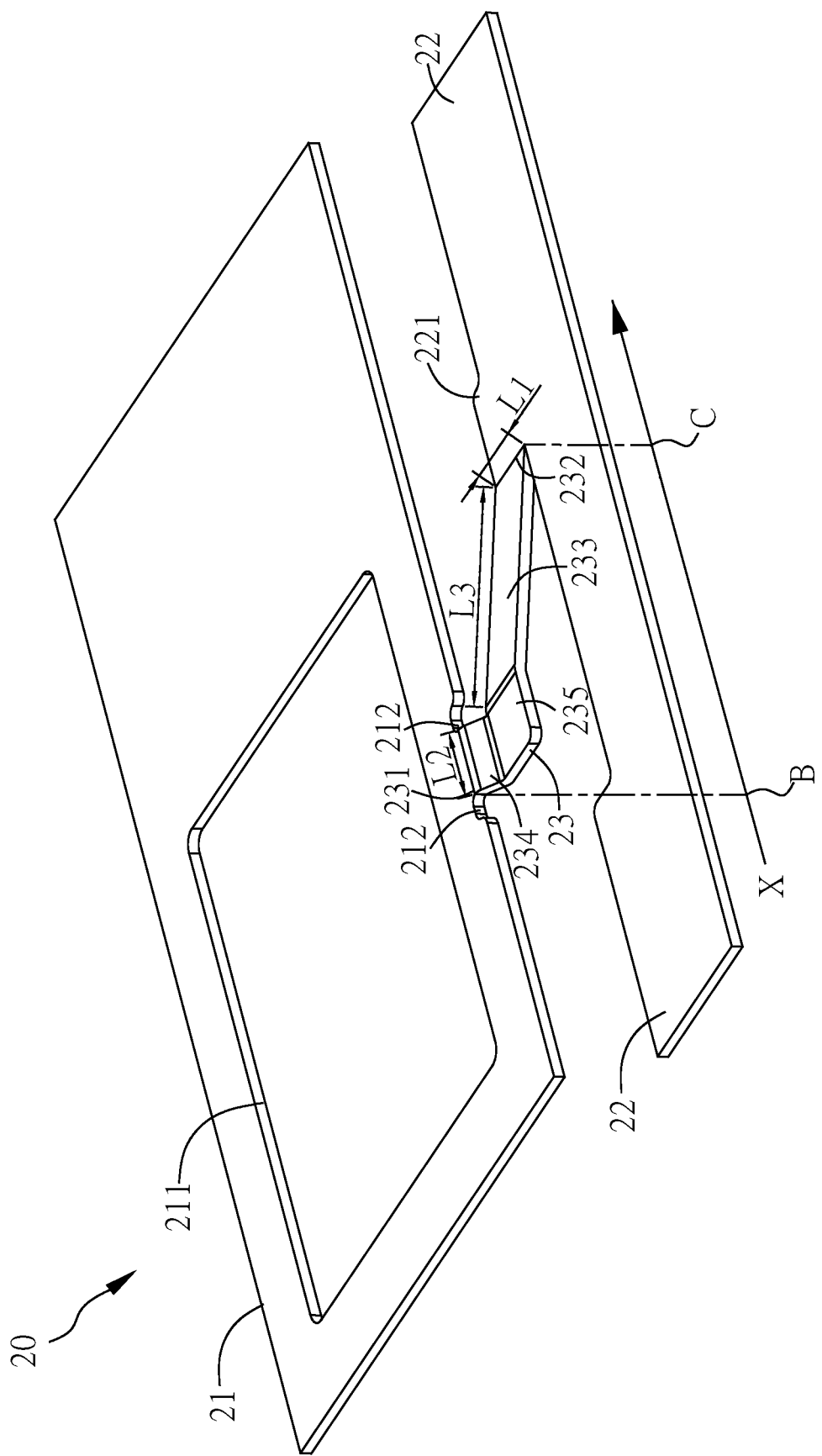
FIG. 5 is an enlarged schematic view of the thin film circuit board as shown in FIG. 4.

The connecting portion 23 has a first connecting end 231, a second connecting end 232, and an inclined segment 233. The first connecting end 231 is connected to the first region 21. The second connecting end 232 is connected to the second region 22. The inclined segment 233 is located between the first connecting end 231 and the second connecting end 232. In this embodiment, the first connecting end 231 and the second connecting end 232 correspond to different positions on the axial direction X, as shown in FIG. 5. FIG. 5 is an enlarged schematic view of the thin film circuit board as shown in FIG. 4. The first connecting end 231 corresponds to a position B on the axial direction X; the second connecting end 232 corresponds to a position C on the axial direction X. Moreover, the position B is different from the position C. Because the first connecting end 231 and the second connecting end 232 correspond to different positions on the axial direction X, and because the inclined segment 233 is located between the first connecting end 231 and the second connecting end 232, the extension direction of the inclined segment 233 contains a component in the axial direction X. In this embodiment, the inclined segment 233 can extend downward and extend along the axial direction X, i.e. toward the second connecting end 232. Thus, a longer connecting portion 23 can be formed. However, please note that the scope of the present application is not limited to the above description. Preferably, the component in the X direction of the extension direction of the inclined segment 233 is larger than the component in the Y direction of the extension direction of the inclined segment 233.

In this embodiment, the first connecting end 231 is parallel to the axial direction X. Thus, it is parallel to the long axis of the first region 21, too. In this embodiment, an extending segment 234 and a planar segment 235 are first disposed at the first connecting end 231 such that the inclined segment 233 can extend downward and extend along the axial direction X. More specifically, the extending segment 234 and the planar segment 235 extend from the first connecting end 231 toward the second region 22. In other words, the extending segment 234 and the planar segment 235 extend along a direction which is perpendicular to the axial direction X. Moreover, one side of the extending segment 234 is connected to the first connecting end 231. The other side of the extending segment 234 extends continuously toward the second region 22 and forms the planar segment 235. In other words, two opposite sides of the extending segment 234 are connected to the first connecting end 231 and the planar segment 235, respectively. Furthermore, the inclined segment 233 extends from a side of the planar segment 235 adjacent to the extending segment 234 to the second connecting end 232. Take the view orientation of FIG. 4 for example: The second connecting end 232 is located on the right side of the planar segment 235. Thus, the inclined segment 233 can extend rightward from the right side of the planar segment 235 to the second connecting end 232. In other embodiments, if the second connecting end 232 is disposed on the left side of the planar segment 235, the inclined segment 233 can extend leftward from the left side of the planar segment 235 to the second connecting end 232, too.

In addition, in this embodiment, the second connecting end 232 is not parallel to the axial direction X. Preferably, the second connecting end 232 can be perpendicular to the axial direction X, i.e. perpendicular to the long axis of the second region 22. The inclined segment 233 extends rightward from the right side of the planar segment 235 and is then connected to the second connecting end 232 directly. In other embodiments, the second connecting end 232 can be parallel to the axial direction X. In this case, there can be one more planar segment and one more extending segment disposed at the second connecting end 232. The additional planar segment and extending segment extend along a direction which is perpendicular to the axial direction X. The inclined segment 233 extends downward along the axial direction X, and it is then connected to the second connecting end 232 by the additional planar segment and extending segment. In other embodiments, the first connecting end 231 and the second connecting end 232 can both be perpendicular to the axial direction X. In this case, the extending segment 234 and the planar segment 235 are not needed.

In this embodiment, two opposite sides of the inclined segment 233 are connected to the planar segment 235 and the second connecting end 232, respectively. Thus, the width of the inclined segment 233 is substantially equal to the length L1 of the second connecting end 232. Moreover, the width of the inclined segment 233 (i.e. the length L1 of the second connecting end 232) can be adjusted according to the configuration of tracks (circuits) of the connecting portion 23. Preferably, the length L2 of the first connecting end 231 is substantially equal to the length L1 of the second connecting end 232 such that the width of the planar segment 235 is also equal to the width of the inclined segment 233 so as to provide space for the configuration of the tracks.

Figure 1:
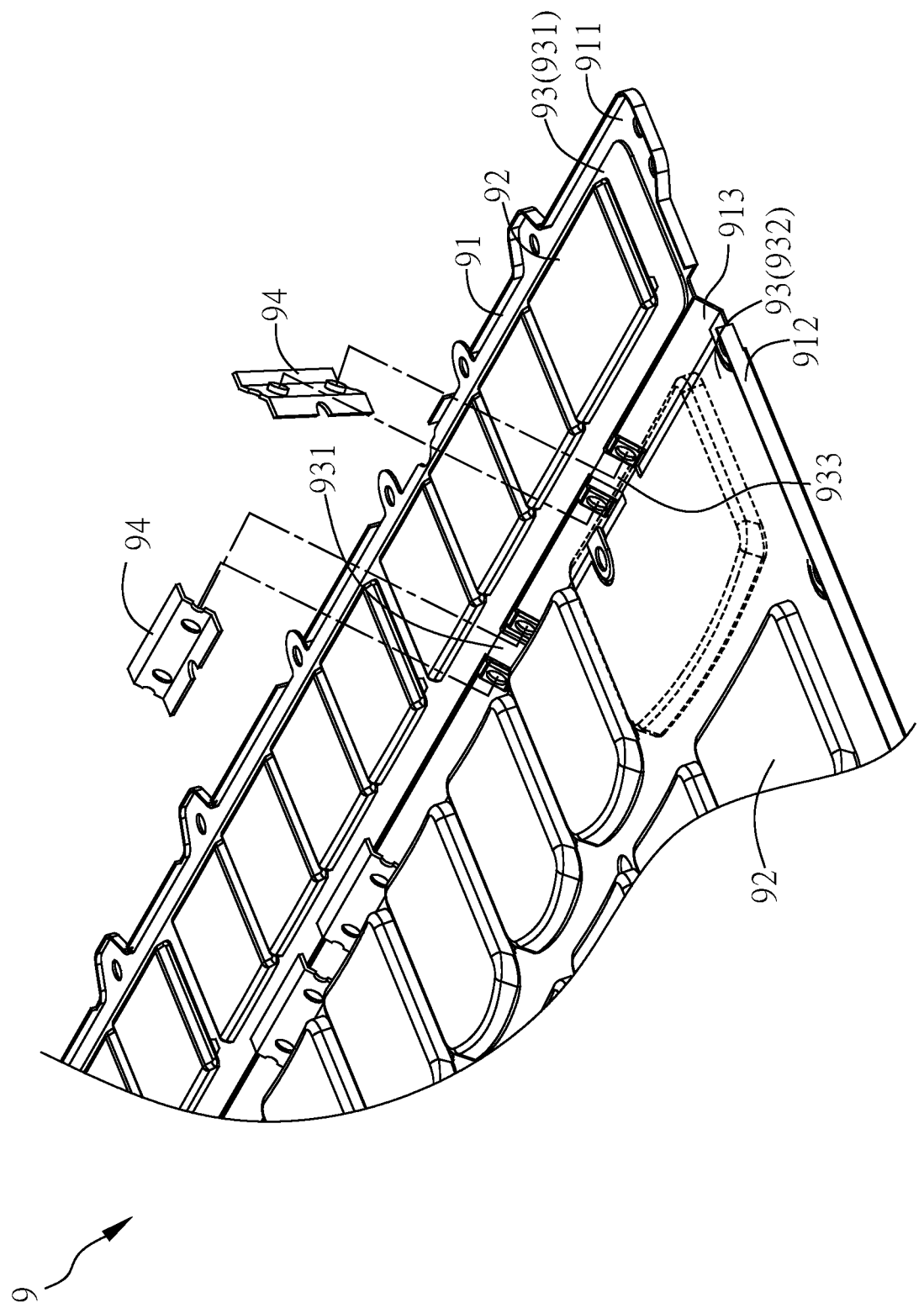
FIG. 1 is a schematic drawing of a prior art keyboard having a stepped base plate.

When we compare the thin film circuit board 20 to the prior art thin film circuit board 93 (as shown in FIG. 1), we see that two ends of the connecting portion 933, which the first region 931 and the second region 932 are connected to, are both parallel to the long axis of the first region 931 and (corresponds to the axial direction X of the present embodiment). Moreover, two ends of the connecting portion 933 correspond to the same position on the long axis of the first region 931 and the second region 932. Thus, the length of the connecting portion 933 is limited by the length of the inclined part of the base plate 91. In other words, the length of the prior art connecting portion 933 can only be shorter than or equal to the length of the inclined part. In this embodiment, because the first connecting end 231 and the second connecting end 232 correspond to different positions on the axial direction X, and because the inclined segment 233 is located between the first connecting end 231 and the second connecting end 232, the extension direction of the inclined segment 233 contains a component in the axial direction X. In this embodiment, the inclined segment 233 extends along the axial direction X. Thus, a longer connecting portion 23 can be formed without being limited by the length of the inclined part 13. Moreover, this reduces the elastic stress of the material of the thin film circuit board 20. In addition, the length L3 of the inclined segment 233 can be adjusted according to the width of the inclined segment 233 (i.e. the length L1 of the second connecting end 232), the slope of the inclined segment 233, the thickness of the connecting portion 23, and the material of the thin film circuit board 20. Therefore, the length L3 is not limited to the above description.

Furthermore, when the thin film circuit board 20 and the base plate 10 are assembled together, part of the connecting portion 23 is located in the hollow portion 133, as shown in FIG. 2. In this embodiment, the limiting portion 134 is disposed in a position corresponding to the inclined segment 233 such that when the thin film circuit board 20 is disposed on the base plate 10, part of the inclined segment 233 is located under the limiting portion 134 (i.e. an area A shown in FIG. 3). Therefore, if the inclined segment 233 of the connecting portion 23 bounces upward because of its own elastic force, the limiting portion 134 presses against the connecting portion 23 (prevents the connecting portion 23 from moving) to fix the connecting portion 23.

Preferably, the second region 22 has a protruding portion 221. Moreover, the protruding portion 221 extends toward the first region 21 (extends forward) from the side of the second connecting end 232 such that one end of the protruding portion 221 can be connected to part of the second connecting end 232. When the thin film circuit board 20 is disposed on the base plate 10, the protruding portion 221 and part of the inclined segment 233 are both located under the limiting portion 134 (i.e. the area A shown in FIG. 3). With the design of the protruding portion 221, the inclined segment 233 of the connecting portion 23 sinks further into the hollow portion 133 such that the thin film circuit board 20 is more firmly fixed to the base plate 10. In addition, when the thin film circuit board 20 and the base plate 10 are assembled together, one simply aligns the connecting portion 23 with the hollow portion 133 and puts the inclined segment 233 into the hollow portion 133 such that the thin film circuit board 20 is fixed to the base plate 10. This greatly simplifies the operation and reduces the steps of assembly.

Preferably, the inclined part 13 of the base plate 10 has at least one supporting portion 135. The supporting portion 135 extends from the lower edge 132 toward the upper edge 131. Moreover, where the supporting portion 135 is disposed corresponds to the planar segment 235 of the connecting portion 23 such that the supporting portion 135 can support the planar segment 235, which extends toward the second region 22. Furthermore, the width of the supporting portion 135 is roughly equal to the width of the planar segment 235. Thus, the inclined segment 233 can extend downward and rightward from the right side of the supporting portion 135 to form a gentle slope. Preferably, in this embodiment, the first part 11 of the base plate 10 has at least one first concave portion 111; the second part 12 has at least one second concave portion 121. The first concave portion 111 and the second concave portion 121 communicate with the hollow portion 133 of the inclined part 13. The first concave portion 111 and the second concave portion 121 communicate with the hollow portion 133 to form a through hole O. The number of the first concave portions 111 and the number of the second concave portions 121 correspond to the hollow portion 133. The first concave portion 111 is disposed adjacent to the first connecting end 231. Preferably, two opposite sides of the first concave portion 111 are connected to the limiting portion 134 and the supporting portion 135, respectively. The second concave portion 121 is disposed adjacent to the second connecting end 232. Preferably, one end of the second concave portion 121 is connected to the supporting portion 135. The other end is located under the limiting portion 134. With the design of the first concave portion 111 and the second concave portion 121, a greater part of the connecting portion 23 is located in the through hole O. Moreover, the planar segment 235 of the connecting portion 23 can sink into the through hole O through the first concave portion 111. Thus, the thin film circuit board 20 is more firmly fixed to the base plate 10. In this embodiment, the extending segment 234 is disposed corresponding to the first concave portion 111 such that the extending segment 234 can sink into the through hole O. Thus, the height of the planar segment 235 is lower than the height of the first region 21 such that the inclined segment 233 has a gentler gradient. This reduces the elastic stress of the material of the thin film circuit board 20. However, please note that the scope of the present application is not limited to the above description.

Preferably, the first region 21 has at least two arc-shaped concave portions 212 disposed on two opposite sides of the first connecting end 231 and the extending segment 234. The structure of the arc-shaped concave portions 212 can reduce the chance that one will accidentally break the connecting portion 23 during the assembly process. Also, the structure of the arc-shaped concave portions 212 can prevent the connecting portion 23 from breaking when external force is exerted on it.

As described above, the keyboard of the present application includes a base plate and a thin film circuit board. The inclined part of the base plate has a hollow portion and a limiting portion. The lower surface of the limiting portion faces toward the hollow portion. The connecting portion of the thin film circuit board has a first connecting end, a second connecting end, and an inclined segment. Because the first connecting end and the second connecting end correspond to different positions on the axial direction, and because the inclined segment is located between the first connecting end and the second connecting end, the inclined segment can extend downward and extend along the axial direction. Thus, a longer connecting portion can be formed to reduce the elastic stress of the material itself of the thin film circuit board. Also, the situation that the connecting portion bounces up because of elastic force is avoided. Moreover, part of the inclined segment of the connecting portion is located in the hollow portion. Thus, the limiting portion can press against the connecting portion (prevent the connecting portion from moving) such that the thin film circuit board is fixed to the base plate. Therefore, the thin film circuit board is fixed without using other fixing members. This also simplifies the manufacturing process and reduces the steps of assembly.

It is noted that the above-mentioned embodiments are only for illustration. It is intended that the present application cover modifications and variations of this application provided they fall within the scope of the following claims and their equivalents. Therefore, it will be apparent to those skilled in the art that various modifications and variations can be made to the structure of the present application without departing from the scope or spirit of the application.

What is claimed is:

1. A keyboard, comprising:
 a base plate, comprising:
  a first part and a second part; and
  an inclined part, having an upper edge and a lower edge, the upper edge being connected to the first part, the lower edge being connected to the second part, the upper edge and the lower edge extending along an axial direction, the inclined part comprising at least one hollow portion and at least one limiting portion, the limiting portion extending from the upper edge toward the lower edge, a lower surface of the limiting portion facing toward the hollow portion; and a thin film circuit board, disposed on the base plate, the thin film circuit board comprising:
  a first region, located on the first part;
  a second region, located on the second part; and
  at least one connecting portion, having a first connecting end, a second connecting end, and an inclined segment, the first connecting end being connected to the first region, the second connecting end being connected to the second region, the first connecting end and the second connecting end corresponding to different positions on the axial direction, the inclined segment being located between the first connecting end and the second connecting end, part of the inclined segment being located in the hollow portion, part of inclined segment being located under the limiting portion.

2. The keyboard as claimed in claim 1, wherein the connecting portion comprises an extending segment and a planar segment, wherein two opposite sides of the extending segment are connected to the first connecting end and the planar segment, respectively, the extending segment and the planar segment extend from the first connecting end toward the second region, and the inclined segment extends from a side of the planar segment adjacent to the extending segment to the second connecting end along the axial direction.

3. The keyboard as claimed in claim 2, wherein the inclined part has at least one supporting portion, and the supporting portion corresponds to the planar segment of the connecting portion and supports the planar segment.

4. The keyboard as claimed in claim 3, wherein the supporting portion extends from the lower edge toward the upper edge.

5. The keyboard as claimed in claim 4, wherein the first part has at least one first concave portion, and the first concave portion communicates with the hollow portion of the inclined part and is disposed adjacent to the first connecting end.

6. The keyboard as claimed in claim 4, wherein the second part has at least one second concave portion, and the second concave portion communicates with the hollow portion of the inclined part and is disposed adjacent to the second connecting end.

7. The keyboard as claimed in claim 1, wherein the width of the inclined segment is substantially equal to the length of the second connecting end.

8. The keyboard as claimed in claim 1, wherein the second region has a protruding portion, and one end of the protruding portion is connected to part of the second connecting end.

9. The keyboard as claimed in claim 1, wherein the length of the first connecting end is substantially equal to the length of the second connecting end.

10. The keyboard as claimed in claim 1, wherein the first region has at least two arc-shaped concave portions disposed on two opposite sides of the first connecting end.

* * * * *